United States Patent
Kuroda et al.

(12) 
(10) Patent No.: US 6,215,229 B1
(45) Date of Patent: Apr. 10, 2001

(54) CHIP-TYPE PIEZOELECTRIC RESONATOR AND METHOD FOR ADJUSTING RESONANCE FREQUENCY THEREOF

(75) Inventors: Hideaki Kuroda, Toyama-ken; Masaya Wajima, Shinminato; Ryuhei Yoshida, Toyama, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/310,237

(22) Filed: May 12, 1999

(30) Foreign Application Priority Data

Jun. 2, 1998 (JP) .................................. 10-153240

(51) Int. Cl.$^7$ ................................ H03H 9/17; H03H 9/13
(52) U.S. Cl. ......................... 310/366; 310/320; 310/348
(58) Field of Search ................................. 310/312, 348, 310/366, 320; 333/186

(56) References Cited

U.S. PATENT DOCUMENTS

| | | | |
|---|---|---|---|
| 3,766,616 | * 10/1973 | Staudte | 29/25.35 |
| 4,837,475 | * 6/1989 | EerNisse et al. | 310/312 |
| 5,357,662 | * 10/1994 | Takagi et al. | 29/25.35 |

FOREIGN PATENT DOCUMENTS

| | | | |
|---|---|---|---|
| 3-240311 | * 10/1991 | (JP) | 310/366 |
| 6-318839 | * 11/1994 | (JP) | 310/366 |
| 11-27078 | * 1/1999 | (JP) | 310/366 |
| 11-346138 | * 12/1999 | (JP) | 310/366 |

\* cited by examiner

*Primary Examiner*—Thomas M. Dougherty
(74) *Attorney, Agent, or Firm*—Keating & Bennett, LLP (57) ABSTRACT

A capacitor-included, chip-type piezoelectric resonator allows minute and highly precise adjustment of electrostatic capacitance and the resonance frequency after production of the piezoelectric resonator by laminating a piezoelectric element and dielectric substrates. The resonator includes a piezoelectric substrate laminated with dielectric substrates and external electrodes disposed on the laminate body. A plurality of external electrodes are arranged to extend from the outer major surface of the first dielectric substrate to the outer major surface of the second dielectric substrate along first and second side surfaces disposed opposite to each other. On the outer major surface of the second dielectric substrate, at least one external electrode is divided into first and second electrode portions.

20 Claims, 6 Drawing Sheets

CHIP-TYPE PIEZOELECTRIC RESONATOR AND METHOD FOR ADJUSTING RESONANCE FREQUENCY THEREOF

BACKGROUND OF THE INVENTION

1. Field of the Invention

The present invention relates to a chip-type piezoelectric resonator including a capacitor and to a method for adjusting the resonance frequency of the chip-type piezoelectric resonator. More particularly, the present invention relates to a chip-type piezoelectric resonator including a capacitor having a piezoelectric element disposed between dielectric substrates, as well as, to a method for adjusting the resonance frequency thereof.

2. Description of Related Art

Figure 7A:
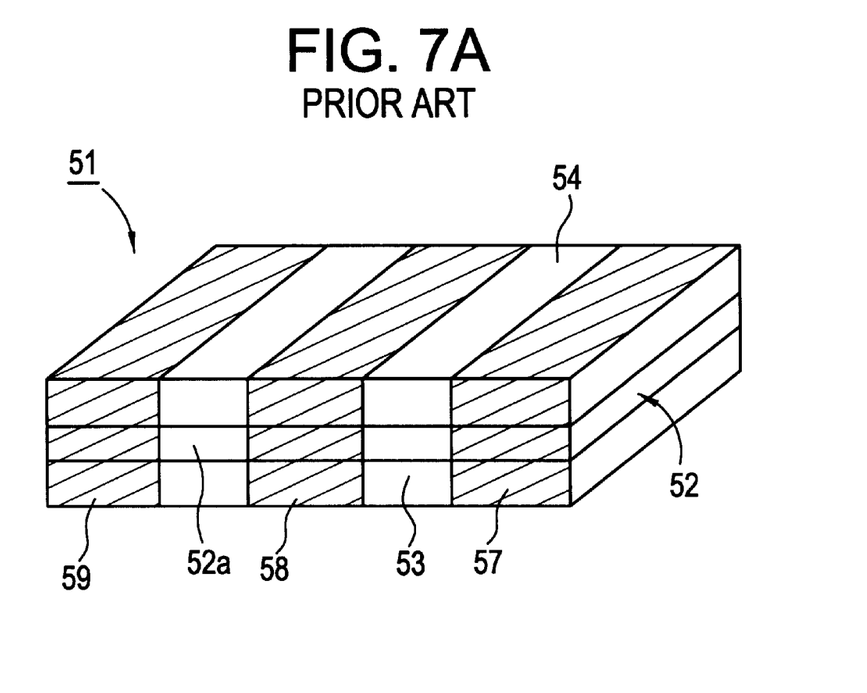
FIG. 7A is a perspective view of a conventional chip-type piezoelectric resonator.
Figure 7B:
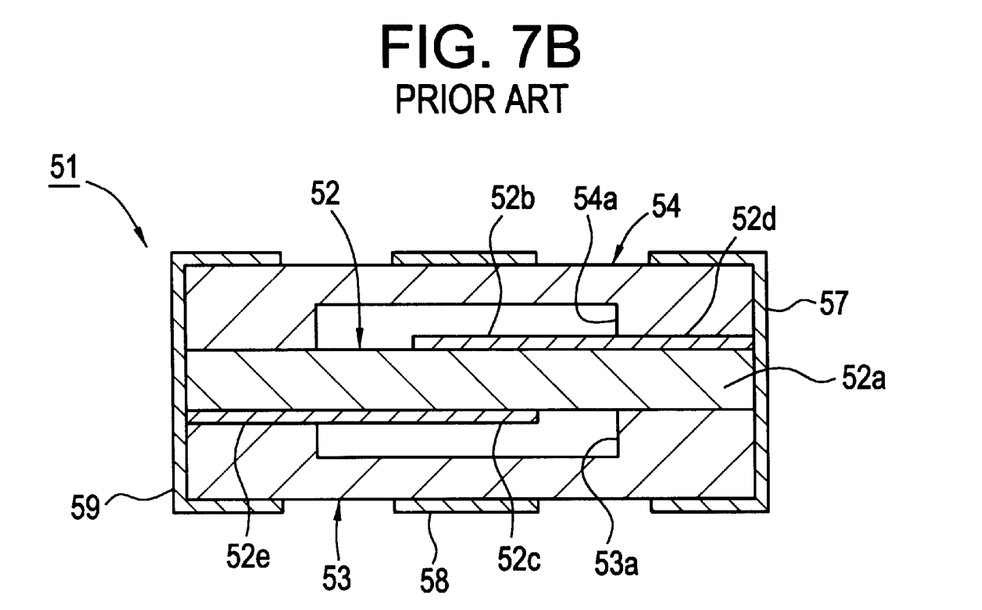
FIG. 7B is a vertical cross-sectional view of the resonator shown in FIG. 7A.

A conventional chip-type piezoelectric resonator including a capacitor is shown in FIGS. 7A and 7B.

As shown in FIG. 7A, in a chip-type piezoelectric resonator 51, a first sealing substrate 53 made of an insulating ceramic is laminated on the lower surface of a plate-like piezoelectric element 52, while a second sealing substrate 54 made of a dielectric ceramic is laminated on the upper surface of the piezoelectric element 52.

The piezoelectric element 52 includes a plate-like piezoelectric substrate 52a which is polarized in a thickness direction. As shown in FIG. 7B, a first excitation electrode 52b is disposed on the upper surface of the piezoelectric substrate 52a and a second excitation electrode 52c is disposed on the lower surface of the piezoelectric substrate 52a, such that the electrode 52b and the electrode 52c face each other with the piezoelectric substrate 52a disposed therebetween.

The excitation electrodes 52b and 52c are connected with lead electrodes 52d and 52e, respectively. The lead electrode 52d is disposed on the upper surface of the piezoelectric substrate 52a so as to extend to a peripheral edge thereof, while the lead electrode 52e is disposed on the lower surface of the piezoelectric substrate 52a so as to extend to another peripheral edge thereof opposite to the peripheral edge to which the lead electrode 52d extends.

A cavity 53a is formed in the inner surface of the sealing substrate 53, and a cavity 54a is formed in the inner surface of the sealing substrate 54.

The piezoelectric element 52 is laminated with the first and second sealing substrates 53 and 54 via an unillustrated adhesive layer, to thereby provide a monolithic structure. External electrodes 57, 58 and 59 are disposed on the outer surface of the resulting laminate. The external electrode 57 is connected to the lead electrode 52d to thereby establish electrical connection with the exitation electrode 52b, while the external electrode 59 is connected to the lead electrode 52e to thereby establish electrical connection with the excitation electrode 52c.

The external electrode 58 is connected to ground. Thus, the resonator is connected between the external electrodes 57 and 59 and electrostatic capacitance is provided between the ground and the external electrodes 57 and 59. Since the sealing substrate 54 is made of a dielectric ceramic, the above-described electrostatic capacitance is substantially defined by the sealing substrate 54 between the external electrode 58 and the external electrodes 57 and 59.

In the chip-type resonator 51 shown in FIGS. 7A and 7B, once the sealing substrates 53 and 54 have been bonded to the piezoelectric element 52, the surfaces other than side surfaces, i.e., the upper and the lower surfaces of the piezoelectric element 52, are sealed by the sealing substrates 53 and 54. Therefore, the resonance frequency must be adjusted prior to bonding of the piezoelectric element 52 to the sealing substrates 53 and 54.

However, even after the bonding step of the piezoelectric element 52 and the sealing substrates 53 and 54, the adjusted frequency tends to vary, due to factors occurring in subsequent manufacturing and processing steps. Thus, even if the resonance frequency is controlled with high precision during the step of producing the piezoelectric element 52, the production of a chip-type piezoelectric resonator 51 having high precision in terms of achieving a desired frequency is very difficult. Therefore, the percent ratio of non-defective chip-type piezoelectric resonators 51 is disadvantageously low.

When an external electrode portion of the sealing substrate 54 made of a dielectric ceramic is partially removed after production of the chip-type piezoelectric resonator 51, the electrostatic capacitance changes significantly, so that fine adjustment of the resonance frequency is very difficult.

In addition, since the shapes of the external electrodes as viewed from the upper-surface side is identical to those as viewed from the lower-surface side, automated recognition of the top and reverse sides of the resonator has been difficult.

Figure 8A:
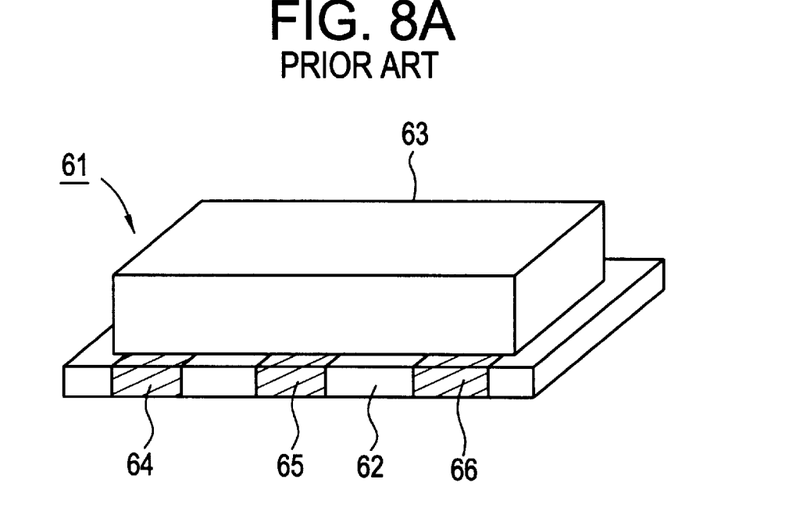
FIG. 8A is a perspective view of another conventional chip-type piezoelectric resonator.
Figure 8B:
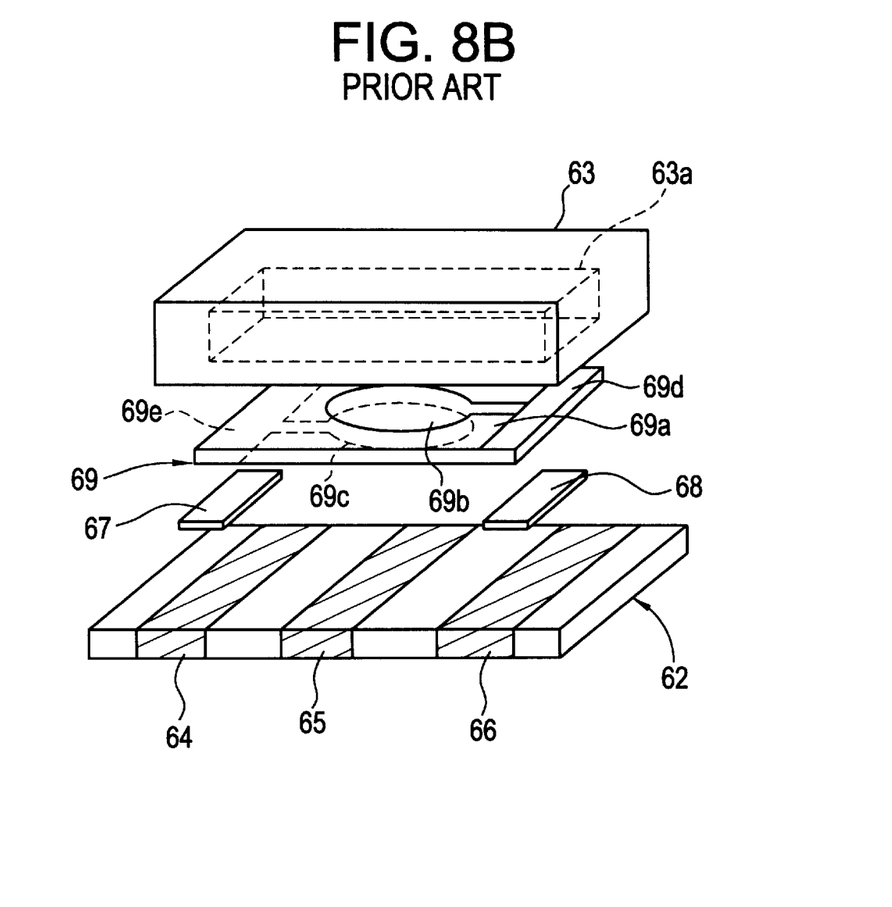
FIG. 8B is an exploded perspective view of the resonator shown in FIG. 8A.

Another conventional chip-type piezoelectric resonator including a capacitor is shown in FIGS. 8A and 8B.

A chip-type piezoelectric resonator 61 has a package structure including a dielectric substrate 62 and a downwardly-opening cap 63.

As shown in FIGS. 8A and 8B, external electrodes 64, 65 and 66 are disposed on the dielectric substrate 62 such that the electrodes extend from the upper surface of the substrate to the lower surface thereof via two side surfaces. A piezoelectric element 69 is bonded to the external electrodes 64 and 66 via conductive adhesive layers 67 and 68. The piezoelectric element 69 is made of a plate-like piezoelectric substrate 69a. A first excitation electrode 69b is disposed on the upper surface of the piezoelectric substrate 69a, and a second excitation electrode 69c is disposed on the lower surface thereof.

The first excitation electrode 69b is connected to a lead electrode 69d. The lead electrode 69d is arranged on the piezoelectric substrate 69a so as to extend to a peripheral edge thereof and further to extend to the lower surface of the piezoelectric substrate 69a via the side surface. The lead electrode 69d is bonded to the conductive adhesive layer 68 at a portion at which the lead electrode 69d reaches the lower surface of the piezoelectric substrate 69a.

The second excitation electrode 69c is connected to a lead electrode 69e, which is bonded to the conductive adhesive layer 67.

The cap 63, having an opening 63a which covers the above-described piezoelectric element 69, is bonded onto the upper surface of the dielectric substrate 62 via an insulating adhesive which is not shown in FIGS. 8A and 8B.

In the chip-type piezoelectric resonator 61, resonance portions having first and second excitation electrodes 69b and 69c, respectively, are connected between external electrodes 64 and 66. The external electrode 65 is connected to ground. Thus, electrostatic capacitance attributed to the dielectric substrate 62 is provided between the external electrode 65 and each of the external electrodes 64 and 66.

In the chip-type piezoelectric resonator 61 shown in FIGS. 8A and 8B, the resonance frequency can be adjusted, prior to bonding of the cap 63 to the dielectric substrate 62, in a state in which the piezoelectric element 69 has been bonded to the dielectric substrate 62. However, when only the excitation electrode on one surface of the piezoelectric element 69 is machined so as to adjust the resonance frequency, the symmetry between the excitation electrodes 69b and 69c is lost. Thus, spurious vibrations attributed to asymmetry of the excitation electrodes 69b and 69c increases, therefore disadvantageously deteriorating the characteristics of the resonator.

Alternatively, the resonance frequency can be adjusted by modifying the shape of the external electrodes 64, 65 and 66 at the lower surface of the dielectric substrate 62. However, the lower surface of the dielectric substrate 62 is a surface for mounting, and such modification of the external electrodes 64, 65 and 66 causes variation of mounting conditions among individual chip-type piezoelectric resonators 61.

SUMMARY OF THE INVENTION

To overcome the problems described above, preferred embodiments of the present invention provide a chip-type piezoelectric resonator including a capacitor, which allows easy, highly precise adjustment of the resonance frequency without increasing unfavorable spurious vibrations caused by asymmetry between excitation electrodes, after assembly of a piezoelectric element and a case material.

Preferred embodiments of the present invention also provide a method for adjusting the resonance frequency of a resonator as described in the preceding paragraph.

One preferred embodiment of the present invention provides a chip-type resonator including a piezoelectric element having a piezoelectric substrate including a first major surface and a second major surface, first and second excitation electrodes respectively disposed on the first and second major surfaces of the piezoelectric substrate and opposed to each other with the piezoelectric substrate disposed therebetween, and first and second lead electrodes respectively connected to the first and second excitation electrodes and extending to respective peripheral edges of the piezoelectric substrate, first and second dielectric substrates sandwiching the piezoelectric element to constitute a laminate body, a plurality of external electrodes provided so as to extend from a first outer major surface of the first dielectric substrate to a second outer major surface of the second dielectric substrate along opposing first and second side surfaces of the laminate body, the first and second lead electrodes of the piezoelectric element being connected to any of the plurality of external electrodes, and at least one of the plurality of the external electrodes being divided on the outer major surface of the second dielectric substrate into a first electrode portion which is connected to an external electrode portion disposed on the first side surface and a second electrode portion which is connected to an external electrode portion disposed on the second side surface.

In the above described chip-type piezoelectric resonator, at least one external electrode is divided on the outer major surface of the second dielectric substrate into a first electrode portion which is connected to an external electrode portion disposed on the first side surface and a second electrode portion which is connected to an external electrode portion disposed on the second side surface. With this unique structure, the electrostatic capacitance is easily and accurately adjusted by partially removing at least one of the first and the second electrode portions.

In this case, since the first and the second electrode portions are disposed on the outer major surface of the second dielectric substrate, the process involving partial removal of the electrodes to adjust the electrostatic capacitance can be performed after manufacturing of the chip-type piezoelectric resonator. Furthermore, on the outer major surface of the first dielectric substrate, there is no need to process the external electrode for frequency adjustment. Thus, when the outer major surface of the first dielectric substrate functions as a mounting surface, the capacitance and thus, the resonance frequency, are easily and accurately adjusted without modifying the structure of the external electrodes on the mounting surface.

In addition, since the first and second electrode portions are formed partially on the outer major surface of the second dielectric substrate, it is possible to realize fine adjustment of the electrostatic capacitance and thus, resonance frequency, by partial removal of the first and the second electrode portions.

According to the above described chip-type piezoelectric resonator, the chip-type piezoelectric resonator including a capacitor allows easy and fine adjustment of the resonance frequency without affecting the symmetry of excitation electrodes of a piezoelectric element, i.e., without increasing unfavorable spurious variations attributed to the asymmetry between excitation electrodes after assembly of a piezoelectric element and the dielectric substrates. Thus, the proportion of non-defective chip-type piezoelectric resonators is greatly increased, and the production cost thereof significantly decreases.

Preferably, in the above described chip-type piezoelectric resonator, a dielectric material constituting the first dielectric substrate has a relative dielectric constant greater than that of a dielectric material constituting the second dielectric substrate. Therefore, the electrostatic capacitance attributed to the second dielectric substrate on which the first and the second electrode portions are provided is relatively small. This feature enables even finer and more accurate adjustment of the electrostatic capacitance by partial removal of at least one of the first and the second electrode portions. Thus, the resonance frequency can be adjusted with even higher precision.

Preferably, in the above described chip-type piezoelectric resonator, the first and second electrode portions each have a narrower portion having a width smaller than that of the remainder of the external electrode. By processing such narrower portions, the electrostatic capacitance and resonance frequency can be adjusted more precisely.

Preferably, in the above described chip-type piezoelectric resonator, a plurality of the external electrodes include first and second external electrodes connected to the corresponding first and second lead electrodes, and a third external electrode connected to ground. This preferred feature enables provision of a three-terminal-type capacitor-included piezoelectric resonator which has a unique construction allowing for very precise and accurate adjustment of the resonance frequency.

Preferably, in the three-terminal-type capacitor-included piezoelectric resonator, the first and second external electrodes are divided into first and second electrode portions. In this case, the resonance frequency can be adjusted accurately with high precision by partial removal of at least one of the first and the second electrode portions of the first and the second external electrodes.

Preferably, in the three-terminal-type capacitor-included piezoelectric resonator, the third external electrode is divided into first and second electrode portions, while the first and second external electrodes are not divided into first and second electrode portions but are disposed on the outer major surface of the second dielectric substrate so as to connect the first side surface to the second side surface.

In this case, the electrostatic capacitance and the resonance frequency can be adjusted finely with high precision by partial removal of at least one of the first and the second electrode portions of the third external electrode. In addition, the electrostatic capacitances provided on the opposite sides of the third external electrode are adjusted preferably so as to be substantially identical.

Another preferred embodiment of the present invention provides a method for adjusting the resonance frequency of the above described chip-type piezoelectric resonator, in which the resonance frequency is adjusted by partial removal of at least one of the first and second electrode portions which are formed by dividing the external electrodes on the outer major surface of the second dielectric substrate.

Thus, the electrostatic capacitance in the resonator can be adjusted finely and easily, to thereby adjust the resonance frequency in a similar fashion. Furthermore, since the resonance frequency can be adjusted after production of a chip-type piezoelectric resonator, the yield thereof is greatly improved and the production cost thereof is significantly reduced.

Other features and advantages of the present invention will become apparent from the following description of the invention which refers to the accompanying drawings.

DETAILED DESCRIPTION OF PREFERRED EMBODIMENTS

Figure 1:
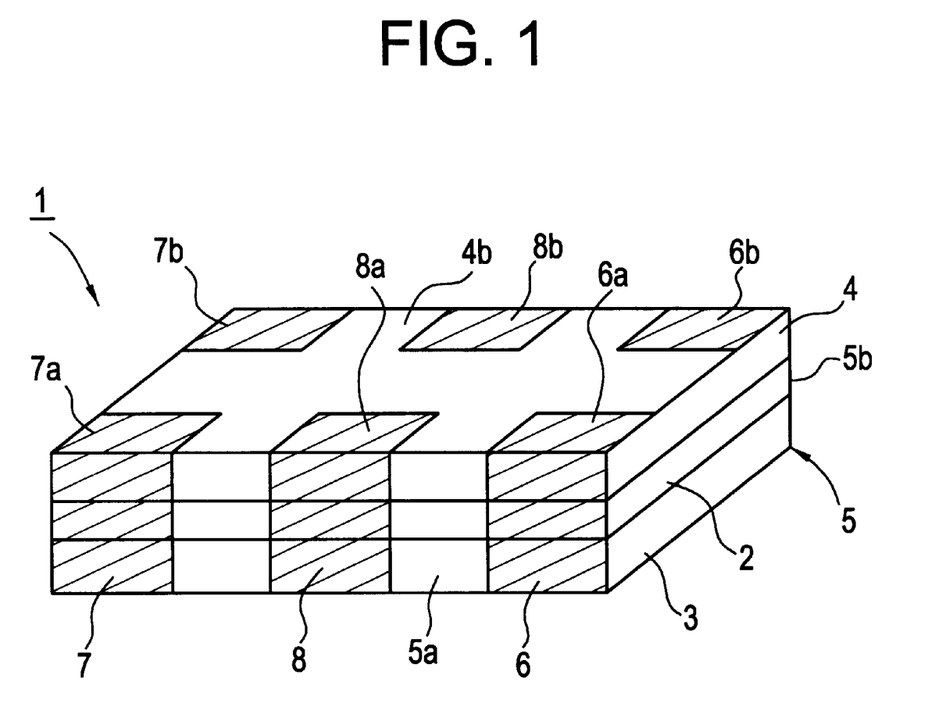
FIG. 1 is a perspective view of a chip-type piezoelectric resonator according to a preferred embodiment of the present invention.
Figure 2:
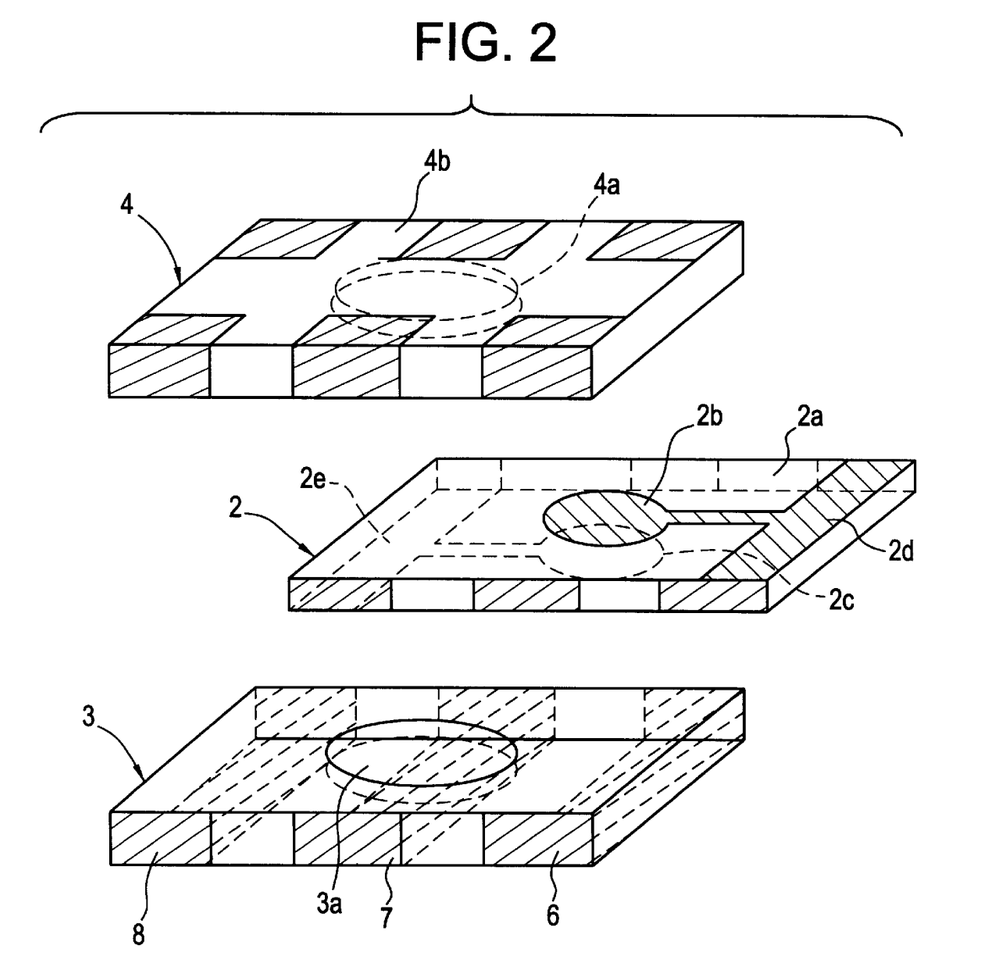
FIG. 2 is an exploded perspective view of the chip-type piezoelectric resonator shown in FIG. 1.

FIG. 1 is a perspective view of a chip-type piezoelectric resonator including a capacitor according to one preferred embodiment of the present invention, and FIG. 2 is an exploded perspective view thereof.

In a chip-type piezoelectric resonator 1, a first dielectric substrate 3 is laminated on the lower surface of a plate-like piezoelectric element 2, while a second dielectric substrate 4 is laminated on the upper surface of the piezoelectric element 2. Thus, a laminate body 5 is preferably defined by the piezoelectric element 2 and the dielectric substrates 3 and 4.

The piezoelectric element 2 preferably includes a substantially rectangular piezoelectric substrate 2a. The piezoelectric substrate 2a is preferably made of a piezoelectric ceramic such as a lead titanate zirconate ceramic and is polarized in a thickness direction. A substantially circular first excitation electrode 2b is disposed on the upper surface of the piezoelectric substrate 2a at the approximate center thereof, while a second excitation electrode 2c is disposed on the lower surface of the piezoelectric substrate 2a at the approximate center thereof, such that the electrodes 2b and 2c face each other.

The first excitation electrode 2b is connected to a first lead electrode 2d disposed on the upper surface of the piezoelectric substrate 2a, the first lead electrode 2d being arranged so as to extend to a peripheral edge of the piezoelectric substrate 2a, while the second excitation electrode 2c is connected to a second lead electrode 2e disposed on the lower surface of the piezoelectric substrate 2a, the lead electrode 2e being disposed on the lower surface of the piezoelectric substrate 2a so as to extend to a peripheral edge thereof.

The excitation electrodes 2b and 2c may have a shape of a circle, rectangle, or other suitable shape.

The first dielectric substrate 3, which is preferably plate-like, is made preferably of a dielectric ceramic having a relative dielectric constant greater than that of a dielectric ceramic constituting the second dielectric substrate 4.

A cavity 3a is formed in the upper surface of the first dielectric substrate 3 in order to provide space which allows vibration of a resonance portion defined between the first excitation electrode 2b and the second excitation electrode 2c.

The second dielectric substrate 4 preferably has a plate-like shape and is made of a dielectric ceramic having a relative dielectric constant of about 20 or more. A cavity 4a is formed in the lower surface of the second dielectric substrate 4 in order to provide space which allows vibration of a resonance portion defined between the first excitation electrode 2b and the second excitation electrode 2c.

The first and second dielectric substrates 3 and 4 are bonded to the piezoelectric element 2 via an unillustrated insulating adhesive, to thereby provide the above-described laminate body 5.

First, second and third external electrodes 6–8 are disposed on the outer surface of the laminate body 5. As is clear from FIGS. 1 and 2, the first, second and third external electrodes 6–8 are arranged so as to extend from the lower surface of the laminate body 5 to the upper surface thereof, i.e., an outer major surface 4b of the second dielectric substrate 4, along first and second side surfaces 5a and 5b oppositely facing each other.

On the outer major surface 4b of the second dielectric substrate 4, the first, second and third external electrodes 6–8 are preferably arranged such that each electrode is divided into first and second electrode portions, i.e., 6a, 6b, 7a, 7b, 8a, and 8b. For example, in the case of the first external electrode 6, the electrode 6 includes the first electrode portion 6a and the second electrode portion 6b on the outer major surface 4b of the second dielectric substrate 4, the electrode portion 6a being arranged so as to be connected to an external electrode portion disposed on the first side surface 5a and the electrode portion 6b being arranged a predetermined distance apart from the first electrode portion 6a, such that the electrode portion 6b is connected to an external electrode portion disposed on the second side surface 5b.

Similarly, the second and the third external electrodes 7 and 8 have first and second electrode portions 7a, 7b, 8a, and 8b.

The first external electrode 6 is connected to the lead electrode 2d, and the second external electrode 7 is connected to the lead electrode 2e. Thus, the resonator having the excitation electrodes 2b and 2c is connected between the external electrodes 6 and 7. The external electrode 8 is connected to ground.

The above constitution provides a capacitor-included, chip-type piezoelectric resonator having three connecting terminals; i.e., external electrodes 6, 7, and 8. In this case, electrostatic capacitance is generated between the external electrode 8 and the external electrode 6 or 7.

More specifically, a first electrostatic capacitance is formed by portions of the dielectric substrates 3 and 4 located between the external electrodes 6 and 8 and a second electrostatic capacitance is formed by portions of the dielectric substrates 3 and 4 located between the external electrodes 7 and 8.

In the chip-type piezoelectric resonator 1 of the present preferred embodiment, the first and second electrode portions 6a–8b are disposed on the upper surface of the laminate body 5, i.e., the outer major surface 4b of the second dielectric substrate 4, to thereby enable easy adjustment of the electrostatic capacitance by modification of the shapes of the electrode portions 6a–8b. Briefly, the resonance frequency of the chip-type piezoelectric resonator 1 is easily adjusted by producing the chip-type piezoelectric resonator 1 illustrated in FIG. 1 and removal; e.g., laser-trimming, a portion of the above divided electrodes 6a–8b. Since frequency adjustment can be performed after the piezoelectric element 2 is laminated with the dielectric substrates 3 and 4, and the external electrodes 6, 7 and 8 are disposed on the laminate body 5, a chip-type piezoelectric resonator 1 having a resonance frequency of a desired adjustment range can be obtained with ease and high precision.

In the present preferred embodiment, the relative dielectric constant of a dielectric ceramic constituting the dielectric substrate 3 is preferably greater than that of a dielectric ceramic constituting the dielectric substrate 4. Further, the external electrode 8 facing the external electrode 6 or 7 extends over a longer distance on the dielectric substrate 3 than on the dielectric substrate 4. Therefore, the electrostatic capacitance of the laminate body 5 greatly depends on that provided from the portions between the external electrodes 8 and 6 and between the external electrodes 8 and 7 of the dielectric substrate 3.

In other words, the electrostatic capacitance provided from the portions between the external electrodes 8 and 6 and between the external electrodes 8 and 7 of the dielectric substrate 4 is smaller than the corresponding electrostatic capacitance of the dielectric substrate 3. Therefore, the resonance frequency can be finely adjusted by removing part of at least one portion selected from among the above-described first and second electrode portions 6a–8b. Thus, in the chip-type piezoelectric resonator 1 of the present preferred embodiment, in addition to the resonance frequency being easily adjustable after production of the resonator, the resonance frequency can be adjusted with high precision since the electrostatic capacitance of the resonator can be finely adjusted.

The dielectric substrate 4 is preferably made of a dielectric ceramic having a relative dielectric constant of at least about 20. When a dielectric ceramic having a relative dielectric constant of less than about 20 is used, the resulting electrostatic capacitance is too small for achieving accurate and precise adjustment of the resonance frequency.

Although the relative dielectric constant of a dielectric ceramic used for the first dielectric substrate 3 differs from that of a dielectric constant of the dielectric ceramic used for the second dielectric substrate 4 as described above, in preferred embodiments of the present invention, the two dielectric substrates 3 and 4 may have the same relative dielectric constant. However, the structure of the preferred embodiment is desirable in that fine adjustment of the resonance frequency can be effected by processing of any of the first and second electrode portions 6a–8b.

When the above adjustment of the resonance frequency is performed, not all of the first and second electrode portions 6a–8b are necessarily processed, but at least one electrode portion is processed to thereby complete the adjustment. Preferably, the electrostatic capacitances provided on the opposite sides of the external electrode 8 are adjusted to be substantially identical. Thus, a method in which at least one portion selected from the first and second electrode portions 8a and 8b is adjusted is preferred. Alternatively, there is preferred a method in which at least one portion selected from the first and second electrode portions 6a and 6b is adjusted and. the corresponding portion(s) of the first and second electrode portions 7a and 7b is similarly adjusted.

Although in the above-described preferred embodiment, the first and second electrode portions 6a–8b all have a substantially identical shape of approximately a rectangle, the shapes of the first and second electrode portions may be altered appropriately. Examples of some variants of the shape are shown in FIGS. 3 through 5.

Figure 3:
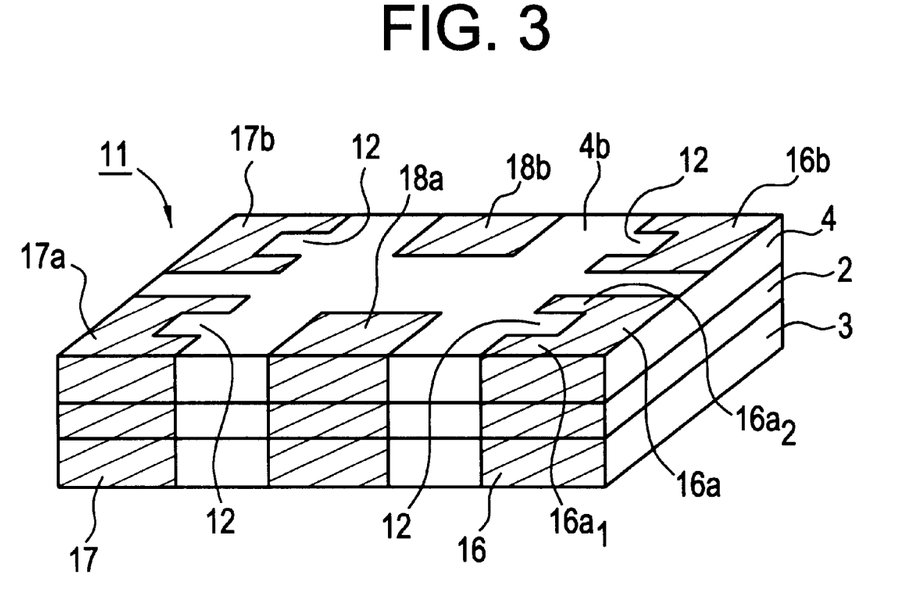
FIG. 3 is a perspective view of a first modification of the chip-type piezoelectric resonator shown in FIG. 1.

In a chip-type piezoelectric resonator 11 shown in FIG. 3, first and second electrode portions 16a and 16b of a first external electrode 16 and first and second electrode portions 17a and 17b of a second external electrode 17 have recesses 12 formed at the sides of the electrode portions facing electrode portions 18b and 18b. By provision of such recesses 12, a recess-formed portion becomes relatively narrower than the remaining portion. For example, in the first electrode portion 16a of the external electrode 16, formation of a recess 12 provides narrower portions $16a_1$ and $16a_2$ at the opposite sides of the recess 12. Thus, the portion $16a_1$ and/or the portion $16a_2$ is removed, to thereby adjust the electrostatic capacitance easily and more finely.

Figure 4:
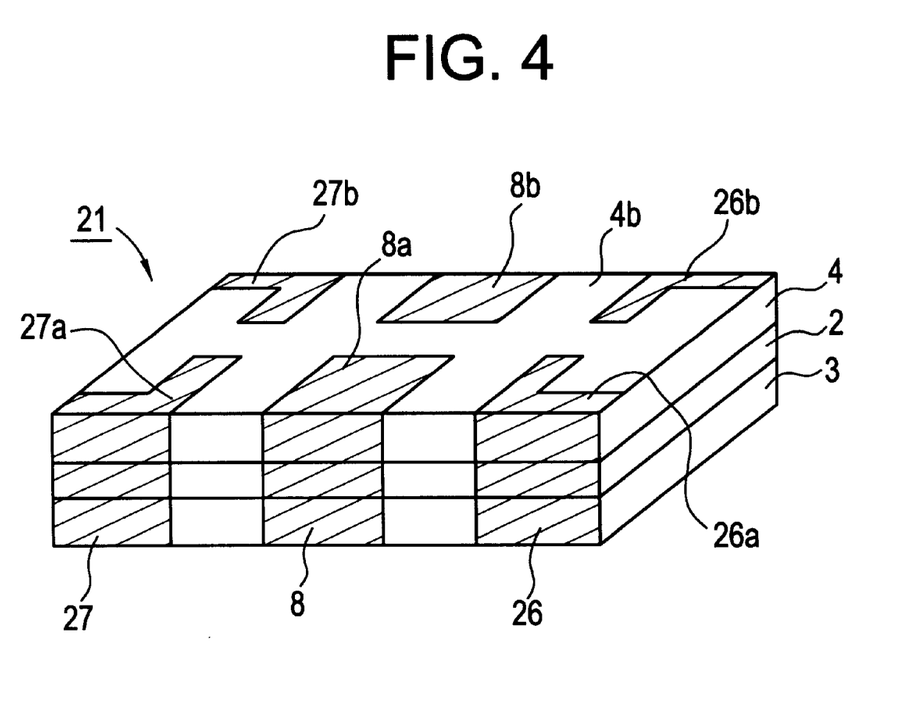
FIG. 4 is a perspective view of a second modification of the chip-type piezoelectric resonator shown in FIG. 1.

In a chip-type piezoelectric resonator 21 shown in FIG. 4, first and second electrode portions 26a, 26b, 27a, and 27b each have a substantially L-like shape. Thus, partial removal of the L-shaped first and second electrode portions 26a–27b can easily be performed, to thereby adjust the electrostatic capacitance easily and more finely.

Figure 5:
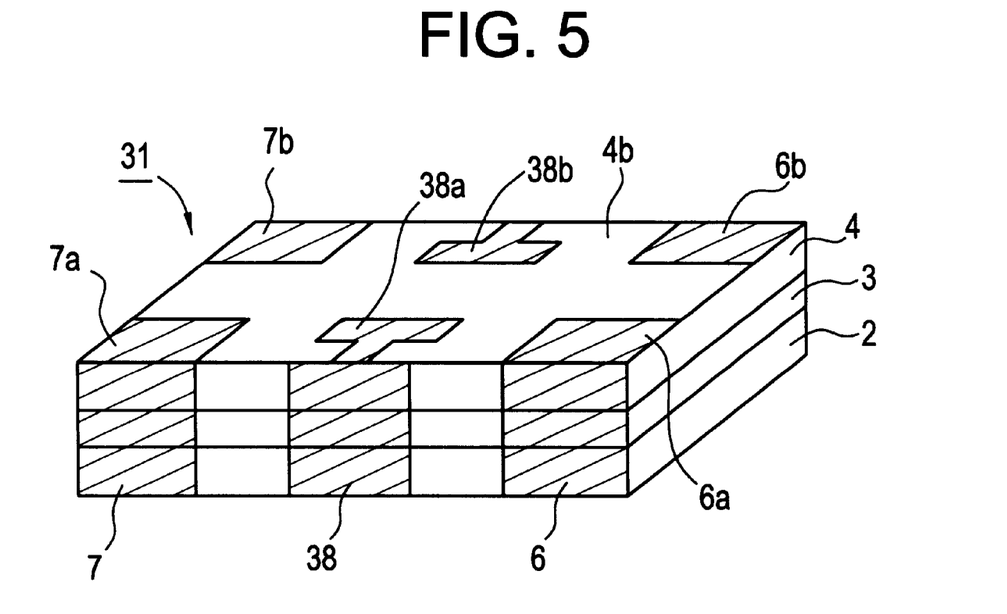
FIG. 5 is a perspective view of a third modification of the chip-type piezoelectric resonator shown in FIG. 1.

In a chip-type piezoelectric resonator 31 shown in FIG. 5, first and second electrode portions 38a and 38b provided in a third external electrode 38 preferably have a substantially T-like shape. Thus, partial removal of the first and second electrode portions 38a and 38b can easily be performed, to thereby adjust the electrostatic capacitance more finely.

Figure 6:
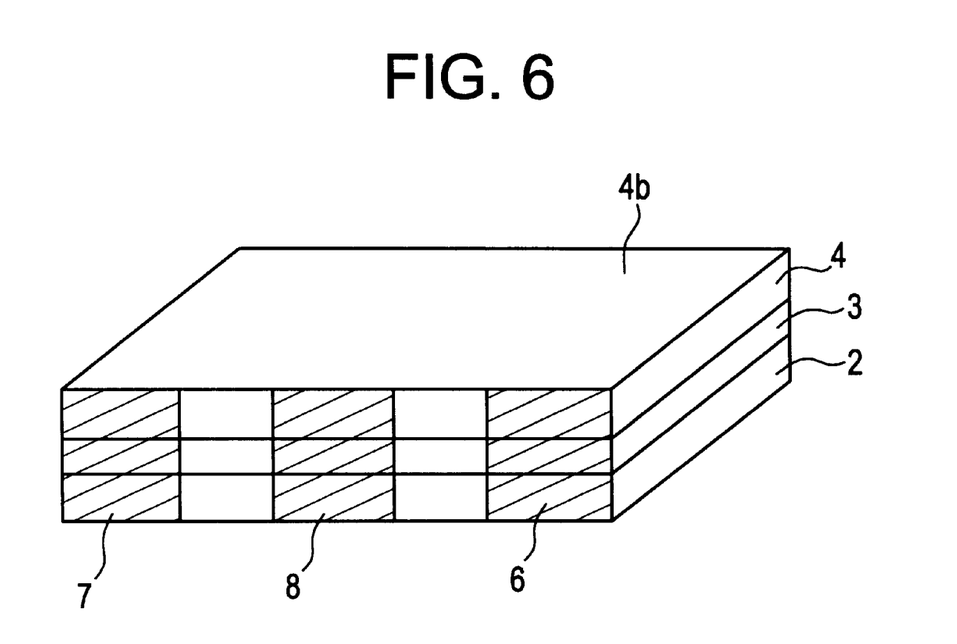
FIG. 6 is a perspective view illustrating an outer shape of the chip-type piezoelectric resonator shown in FIG. 1 when the resonance frequency is adjusted by complete removal of the first and second electrode portions on the upper surface.

Although first and second electrode portions are removed as described above according to the target resonance frequency, in the ultimate case, the electrode portions may be removed entirely, as shown in FIG. 6, to thereby adjust the resonance frequency.

In the above chip-type resonators 1, 11, 21, and 31, the first, second and third external electrodes are all divided into the corresponding first and second electrode portions. However, in other preferred embodiments of the present invention, fine frequency adjustment can be effected through partial removal of a first electrode portion and/or a second electrode portion, so long as division of an external electrode on the major surface of the dielectric substrate 4 is performed on at least one external electrode.

Preferably, in the chip-type piezoelectric resonator 1 having first, second and third external electrodes 6–8, the third external electrode 8 is divided into the first and second electrode portions 8a and 8b, and the first and second external electrodes 6 and 7 are disposed on the outer major surface 4a of the dielectric substrate 4 without being divided, i.e., the two external electrodes have no divided electrode portions 6a, 6b, 7a, and 7b, in order to provide a substantially identical electrostatic capacitance in the portions divided by the third external electrode 8. In this case, when at least one of first and second electrode portions 8a and 8b of the third external electrode 8 is partially removed to thereby adjust the resonance frequency, the electrostatic capacitances in the portions divided by the third external electrode 8 are reliably adjusted to be identical.

Alternatively, the third external electrode 8 may be disposed on the outer major surface 4b without being divided into the first and second electrode portions 8a and 8b, and the first and second external electrodes 6 and 7 may be formed in a divided manner as shown in FIG. 1. In this case, when any of the first and second electrode portions 6a–7b of the first and second external electrodes 6 and 7 is partially removed, removal at the first external electrode 6 and that at the second external electrode 7 are preferably performed in a similar manner.

While the invention has been particularly shown and described with reference to preferred embodiments thereof, it will be understood by those skilled in the art that the forgoing and other changes in form and details may be made therein without departing from the spirit of the invention.

What is claimed is:

1. A chip-type resonator comprising:
   a capacitor;
   a piezoelectric element including:
      a piezoelectric substrate including a first major surface and a second major surface;
      first and second excitation electrodes respectively disposed on the first and second major surfaces of the piezoelectric substrate and opposed to each other with the piezoelectric substrate disposed therebetween; and
      first and second lead electrodes respectively connected to the first and second excitation electrodes and extending to respective peripheral edges of the piezoelectric substrate;
   first and second dielectric substrates sandwiching the piezoelectric element to constitute a laminate body including the piezoelectric element and the first and second dielectric substrates;
   a plurality of external electrodes provided so as to extend from an outer major surface of the first dielectric substrate to an outer major surface of the second dielectric substrate along opposing first and second side surfaces of the laminate body, the plurality of external electrodes being spaced from each other so as to define the capacitor;
   the first and second lead electrodes of the piezoelectric element being arranged and capable of being connected to any of the external electrodes; and
   at least one of the plurality of external electrodes being divided on the outer major surface of the second dielectric substrate into a first electrode portion and a second electrode portion spaced from the first electrode portion on the outer major surface of the second dielectric substrate.

2. The chip-type piezoelectric resonator according to claim 1, wherein a dielectric material constituting the first dielectric substrate has a relative dielectric constant greater than that of a dielectric material constituting the second dielectric substrate.

3. The chip-type piezoelectric resonator according to claim 1, wherein each of the first electrode portion and the second electrode portion has a narrow portion having a width which is smaller than that of a remaining portion of the corresponding one of the plurality of external electrodes.

4. The chip-type piezoelectric resonator according to claim 1, wherein the plurality of the external electrodes include first and second external electrodes respectively connected to the first and second lead electrodes, and a third external electrode connected to ground.

5. The chip-type piezoelectric resonator according to claim 4, wherein the first and second external electrodes are each divided to include first and second electrode portions spaced from each other on the outer major surface of the second dielectric substrate.

6. The chip-type piezoelectric resonator according to claim 4, wherein the third external electrode is divided into first and second electrode portions thereof, and the first and second external electrodes are not divided into first and second electrode portions but are disposed on the outer major surface of the second dielectric substrate so as to connect the first side surface of the laminate body to the second side surface of the laminate body.

7. The chip-type piezoelectric resonator according to claim 4, wherein each of the first, second and third external electrodes is divided to include first and second electrode portions spaced from each other on the outer major surface of the second dielectric substrate.

8. The chip-type piezoelectric resonator according to claim 7, wherein the first external electrode is connected to the first lead electrode, the second external electrode is connected to the second lead electrode and the third external electrode is connected to ground.

9. The chip-type piezoelectric resonator according to claim 1, wherein a first of the external electrodes is arranged to face others of the external electrodes and extends over a longer distance on the first dielectric substrate than on the second dielectric substrate.

10. The chip-type piezoelectric resonator according to claim 1, wherein the plurality of external electrodes includes at least first, second and third external electrodes and an electrostatic capacitance provided by portions between the first and second external electrodes and between the first and third external electrodes of the second dielectric substrate is smaller than the corresponding electrostatic capacitance of the first dielectric substrate.

11. The chip-type piezoelectric resonator according to claim 1, wherein the second dielectric substrate is made of a dielectric ceramic having a relative dielectric constant of at least about 20.

12. The chip-type piezoelectric resonator according to claim 1, wherein the first and second dielectric substrates have the same relative dielectric constant.

13. The chip-type piezoelectric resonator according to claim 1, wherein electrostatic capacitances provided on the opposite sides of one of the external electrodes are substantially identical.

14. The chip-type piezoelectric resonator according to claim 1, wherein the first and second electrode portions each have a substantially L-like shape.

15. The chip-type piezoelectric resonator according to claim 1, wherein the first and second electrode portions each have a substantially T-like shape.

16. A method for adjusting the resonance frequency of a chip-type piezoelectric resonator including the steps of:

providing a chip-type piezoelectric resonator including a capacitor; a piezoelectric element having a piezoelectric substrate including a first major surface and a second major surface, first and second excitation electrodes respectively disposed on the first and second major surfaces of the piezoelectric substrate and opposed to each other with the piezoelectric substrate disposed therebetween, and first and second lead electrodes respectively connected to the first and second excitation electrodes and extending to respective peripheral edges of the piezoelectric substrate, first and second dielectric substrates sandwiching the piezoelectric element to constitute a laminate body including the piezoelectric element and the first and second dielectric substrates, a plurality of external electrodes provided so as to extend from an outer major surface of the first dielectric substrate to an outer major surface of the second dielectric substrate along opposing first and second side surfaces of the laminate body, the plurality of external electrodes being spaced from each other so as to define the capacitor, the first and second lead electrodes of the piezoelectric element being arranged and capable of being connected to any of the external electrodes; and dividing at least one of the plurality of external electrodes on the outer major surface of the second dielectric substrate into a first electrode portion and a second electrode portion which is spaced from the first electrode portion on the outer major surface of the second dielectric substrate.

17. The method according to claim 16, wherein the step of dividing includes the step of by removing a portion of at least one of the first and second electrode portions.

18. The method according to claim 17, wherein the step of removing is done by laser trimming.

19. The method according to claim 16, wherein a dielectric material constituting the first dielectric substrate has a relative dielectric constant greater than that of a dielectric material constituting the second dielectric substrate.

20. The method according to claim 16, wherein each of the first electrode portion and the second electrode portion is formed to have a narrow portion having a width which is smaller than that of a remaining portion of the corresponding one of the plurality of external electrodes.

* * * * *